US012690440B2

(12) United States Patent
Chang et al.

(10) Patent No.: US 12,690,440 B2
(45) Date of Patent: Jul. 21, 2026

(54) THREE-DIMENSIONAL INTEGRATED CIRCUIT WITH HYBRID BOND METAL STRUCTURE

(71) Applicant: Taiwan Semiconductor Manufacturing Company, Ltd., Hsin-Chu (TW)

(72) Inventors: Jui Shen Chang, Taichung City (TW); Yu-Chang Lai, Hsinchu City (TW); Chen-Nan Chiu, Hsinchu City (TW); Yao-Chun Chuang, Hsinchu City (TW); Jun He, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 478 days.

(21) Appl. No.: 18/466,153

(22) Filed: Sep. 13, 2023

(65) Prior Publication Data

US 2024/0395750 A1 Nov. 28, 2024

Related U.S. Application Data

(60) Provisional application No. 63/503,700, filed on May 22, 2023.

(51) Int. Cl.
| | |
|---|---|
| *H10W 20/42* | (2026.01) |
| *H10W 72/90* | (2026.01) |
| *H10W 80/00* | (2026.01) |
| *H10W 90/00* | (2026.01) |

(52) U.S. Cl.
CPC .......... *H10W 20/42* (2026.01); *H10W 72/923* (2026.01); *H10W 72/952* (2026.01); *H10W 80/312* (2026.01); *H10W 80/327* (2026.01); *H10W 90/792* (2026.01)

(58) Field of Classification Search
None
See application file for complete search history.

(56) References Cited

U.S. PATENT DOCUMENTS

| | | | |
|---|---|---|---|
| 8,802,504 B1 | 8/2014 | Hou et al. |
| 8,803,292 B2 | 8/2014 | Chen et al. |
| 8,803,316 B2 | 8/2014 | Lin et al. |

(Continued)

*Primary Examiner* — Michelle Mandala
(74) *Attorney, Agent, or Firm* — HAYNES AND BOONE, LLP

(57) ABSTRACT

One aspect of the present disclosure pertains to an IC packaging structure that includes a bottom circuit structure having first semiconductor devices on a first substrate, a first interconnect structure over the first semiconductor devices, and a first bonding structure over the first interconnect structure; and a top circuit structure having second semiconductor devices on a second substrate, a second interconnect structure underlying the second semiconductor devices, and a second bonding structure underlying the second interconnect structure. The first bonding structure includes a first metal feature having a first crystalline bulk layer of a metal and a first amorphous surface layer of the metal. The second bonding structure includes a second metal feature having a second crystalline bulk layer of the metal and a second amorphous surface layer of the metal. The top circuit structure is bonded to the bottom circuit structure through the first and second amorphous surface layers.

20 Claims, 8 Drawing Sheets

(56)  References Cited

U.S. PATENT DOCUMENTS

| | | | | |
|---|---|---|---|---|
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 11,791,333 | B2 * | 10/2023 | Chen | H10D 88/00 |
| | | | | 257/74 |
| 11,950,432 | B2 * | 4/2024 | Shen | H10B 61/22 |
| 12,550,787 | B2 * | 2/2026 | Ishikawa | H10W 72/019 |
| 2021/0082865 | A1 * | 3/2021 | Baraskar | H10B 43/40 |
| 2021/0098353 | A1 * | 4/2021 | Wu | H10P 72/74 |
| 2021/0375819 | A1 * | 12/2021 | Chen | H10W 70/09 |
| 2022/0068941 | A1 * | 3/2022 | Liu | H10B 10/12 |
| 2023/0299042 | A1 * | 9/2023 | Chen | H10W 90/00 |

* cited by examiner

Crystalline metal
Amorphous metal

Crystalline metal

Amorphous metal

Crystalline metal
Amorphous metal

THREE-DIMENSIONAL INTEGRATED CIRCUIT WITH HYBRID BOND METAL STRUCTURE

PRIORITY

This application claims the benefits of and priority to U.S. Provisional Application No. 63/503,700, filed May 22, 2023, which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Many of the technological advances have occurred in the field of 3D IC packaging, which involves stacking and bonding multiple chips together. Each chip includes at least one functional IC, such as an IC configured to perform a logic function, a memory function, a digital function, an analog function, a mixed signal function, a radio frequency (RF) function, an I/O function, a communications function (e.g., provides support for wired communications and/or wireless communications by implementing desired communication protocols, such as 5G (i.e., 5th generation) wireless communications protocols, Ethernet communications protocols, IB communications protocols, etc.), a power management function, other function, or combinations thereof. memory devices, and some of these involve capacitors.

With continued advances in 3D IC stacking technology, integrated chips have become more versatile and highly heterogenous. These highly integrated devices may experience various bonding issues and stress issues. Therefore, while existing 3DIC structures and the method making the same are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
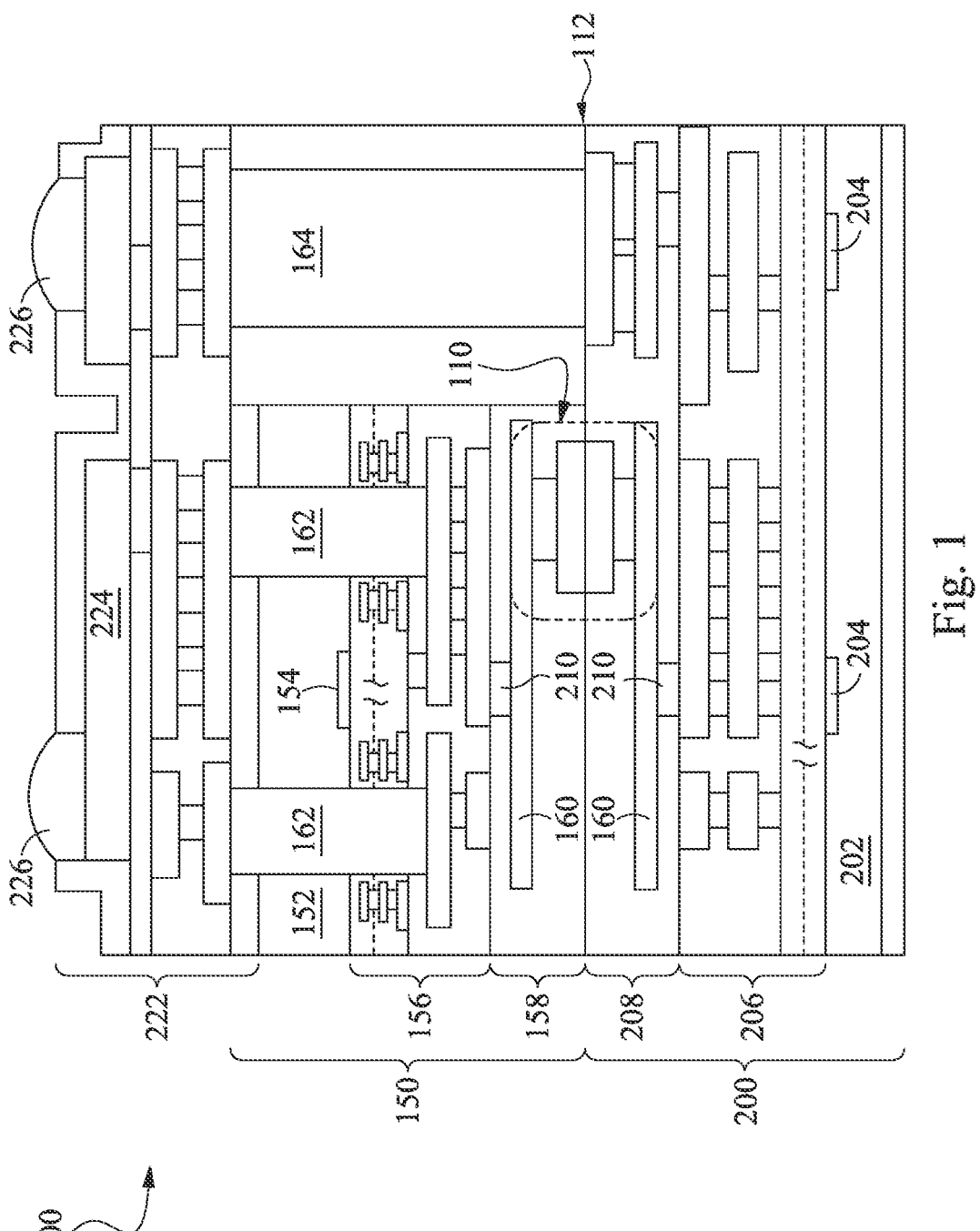
FIG. 1 illustrates a sectional view of a three-dimensional integrated circuit (3DIC) structure, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" may encompass the dimension range from 4.5 nm to 5.5 nm.

The present disclosure relates to methods and structures directed to a 3D integrated circuit (IC) structure and a method making the same. The 3D IC structures are stacked structures with heterogenous integration, for example having logic devices stacked over memory devices, or vice versa. Especially, the present disclosure is directed to the bonding structure of the 3DIC structure and the method forming the same.

3D IC stacking technology experiences various bonding issues and stress issues. For example, the bonding temperature is too high beyond the desired thermal budget, causing unexpected diffusion and reliability issues to already-formed device components and metal features. In another example, the mechanical strength of the bonding structure may not be strong enough, causing delamination issue during the field operations. In the present disclosure, the 3DIC structure includes a bottom semiconductor structure (bottom die or BD) and a top semiconductor structure (top die or TD) bonded together. It is understood that the provided structure is only some embodiments and the 3DIC structure may include more than two semiconductor structures bonded together with similar bonding structure. In furtherance of the embodiments, each of the top die and bottom die includes IC devices formed on a respective substrate, an interconnect structure formed on the corresponding IC devices, and a bonding structure formed on the corresponding interconnect structure. Then two semiconductor structures are bonded together through the disclosed bonding structures. Especially, the bonding structure of each semiconductor structure includes one or more metal bonding feature embedded in a dielectric layer, such as a silicon oxide layer. The metal bonding feature is a metal feature of a same metal, such as copper (Cu). In some alternative embodiments, the metal may be Au, Ag, or Pd. In other embodiments, the metal may additionally or alternatively include Ni, Co, or other suitable metal. However, the metal bonding feature has a heterogenous structure. For example, the first metal bonding feature of the first semiconductor structure includes a first crystalline bulk layer of the metal and a first amorphous surface layer of the metal disposed on the first crystalline bulk layer; and the second metal bonding feature of the second semiconductor structure further includes a second crystalline bulk layer of the metal and a second amorphous surface layer of the metal disposed on the second crystalline bulk layer. The two semiconductor structures are bonding together through the corresponding metal bonding features such that the first and second amorphous surface layers are directly contacting each other and are bonded together. Furthermore, the first and second crystalline bulk layers each include a (111) plane in parallel with the bonding interface between the first and second amorphous surface layers.

The 3DIC structure may further include other metal features, such as bonding pad for electrical routing to the outer package, a printed circuit board (PCB) or other suitable structure with additional mechanical robustness of the interconnect structure. A bonding structure may be additionally formed on one or more metal features of the interconnect structures to further provide additional mechanical strength and reduce the contact resistance of the corresponding interconnect structure, as illustrated below in various embodiments.

Such metal heterogenous bonding structure can benefit both the bonding strength and reduce the bonding temperature. Our experiments and theoretical analysis indicate that the bonding thermal process (such as annealing under pressure) to the amorphous surface layers can be achieved with a reduced bonding temperature and the crystalline bulk layer, especially with a (111) plane oriented in parallel with the bonding interface, can achieve higher mechanical bonding strength, thus improving bonding strength and reducing the temperature of the bonding process overall.

In some embodiments, the first metal bonding feature includes another amorphous surface layer to have a sandwiched structure with a crystalline bulk layer sandwiched between the two amorphous surface layers. In some other embodiments, the second metal bonding feature also includes another amorphous surface layer to have a similar sandwiched structure. This is because the first (or second) bonding structure further includes a metal via landing on the corresponding metal bonding feature. The corresponding interface between the metal bonding feature and the metal via is also enhanced by the amorphous surface layer since similar stress of the interface. In some embodiments, the metal via has a structure similar to that of the metal bonding feature for the similar reasons including enhanced mechanical strength.

The metal bonding feature (or the metal via) is formed by a plating process, such as Electro-Chemical Plating Deposition (ECP). More specifically, the metal bonding feature is formed by a procedure that includes forming a seed metal layer using physical vapor deposition (PVD), atomic layer deposition (ALD), other suitable method or a combination thereof. The procedure further includes a first ECP process to form amorphous surface layer and a second ECP process to form crystalline bulky layer.

In some embodiments for both ECP processes, the plating solution includes Copper sulfate ($CuSO_4$), hydrochloric acid, sulfuric acid, or a combination thereof. The plating solution may further include other additives to tune and optimize plating solution, such as its plating rate, plating selectivity, plating solution stability and other effects. In some embodiments, the additive used in the plating solution may include bis(3-sulfopropyl) disulfide (SPS), polyethylene glycol (PEG), gelatin, Janus Green B (JGB), mercaptopropylsulfonic acid (MPS), sodium dodecyl sulfate (SDS), or a combination thereof.

The two ECP processes are designed differently to achieve the respective structures, such as amorphous Cu layer and a crystalline Cu layer (or particularly, a crystalline Cu layer with a (111) plane in parallel to the bonding interface). This includes, but not limited to, different additives in plating solution; different pH values of the plating solution; different electroplating modes (such as direct current (DC) mode or pulse mode); plating solution temperature; frequency of the pulse mode; duty cycle (ratio of the power duration in one cycle); or a combination thereof. The two ECP processes are further described below according to various embodiments. In some embodiments, forming the crystalline Cu layer (particularly, a crystalline Cu layer with a (111) plane in parallel to the bonding interface) includes a relatively a first amount of additives and forming the amorphous Cu layer includes a second amount of additives greater than the first amount of additives. In some embodiments, forming the crystalline Cu layer (particularly, a crystalline Cu layer with a (111) plane in parallel to the bonding interface) includes applying both pulse power and direct current (DC) power and forming the amorphous Cu layer includes applying only DC power. In some embodiments, forming the crystalline Cu layer (particularly, a crystalline Cu layer with a (111) plane in parallel to the bonding interface) includes a first temperature of the plating solution and forming the amorphous Cu layer includes a second temperature of the plating solution less than the first temperature.

FIG. 1 is a cross-sectional view of a 3DIC structure 100 constructed in accordance with some embodiments. In the illustrated example, the 3DIC structure 100 includes a top (or first) semiconductor structure 150 and a bottom (or second) semiconductor structure 200 bonded together through one or more bonding structure 110 (as illustrated in the dashed line box) formed at the bonding interface 112 between the top semiconductor structure 150 and the bottom semiconductor structure 200, and the structure and the method making the same will be further described later in details. Each of the bonding structures 110 is laterally surrounded by one or more dielectric material extending to the bonding interface. The bonding structure 110 not only provides the bonding between the two semiconductor structures 150 and 200 but also provides electrical routing and couples between the interconnect structures 156 and 206. The bonding interface 112 includes the metal bonding structures 110 and includes a dielectric-dielectric bonding structure as well, such as dielectric portions adjacent the bonding structures 110 in the bonding interface 112.

Two semiconductor structures 150 and 200 in the 3DIC structure 100 include semiconductor substrates 152 and 202, semiconductor devices 154 and 204 formed thereon respectively, interconnect structures 156 and 206 formed on respective semiconductor devices 154 and 204, and passivation (or other suitable dielectric) layers 158 and 208 formed on respective interconnect structures 156 and 206 with redistribution layers 160 and 210 and bonding structures 110 embedded therein. Each of the bonding structures 110 is distributed in both the passivation layers 158 and 208 of the two semiconductor structures 150 and 200. The 3DIC structure 100 further includes feedthrough vias 162 and 164 penetrating through the semiconductor substrate 152 to couple various semiconductor devices (such as semiconductor devices 154 and semiconductor devices 204) to a backside interconnect structure 222 formed on the backside of the semiconductor substrate 152, thereby providing electrical routing from bond pads to the outer packaging, a printed circuit board (PCB) or other suitable packaging structure. The backside interconnect structure 222 may further include a redistribution layer 224 and bond pads 226.

The substrate includes a bulk silicon substrate. Alternatively, the substrate may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates also include a silicon-on-insulator (SOI) substrate. SOI substrates are fabricated using separation by implantation of oxygen (SIMOX), wafer bonding, and/or other suitable methods. The substrate also includes various isolation features, such as isolation features formed on the substrate and defining various active regions on the substrate, such as an active region. The isolation feature utilizes isolation technology, such as shallow trench isolation (STI), to define and electrically isolate the various active regions. The isolation feature includes silicon oxide, silicon nitride, silicon oxynitride, other suitable dielectric materials, or combinations thereof. The isolation feature is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide. The active region is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate or different semiconductor material, such as silicon germanium (SiGe), silicon carbide (SiC), or multiple semiconductor material layers (such as alternative silicon and silicon germanium layers) formed on the substrate by epitaxial growth, for performance enhancement, such as strain effect to increase carrier mobility.

The semiconductor devices 154 and 204 may include field-effect transistors (FETs), fin FETs (FinFETs), gate-all around (GAA) transistors, complimentary field-effect transistors (CFETs), other suitable passive devices, active devices or a combination thereof. The semiconductor substrate may include silicon substrate, compound semiconductor substrate, or other suitable semiconductor substrate.

Figure 2:
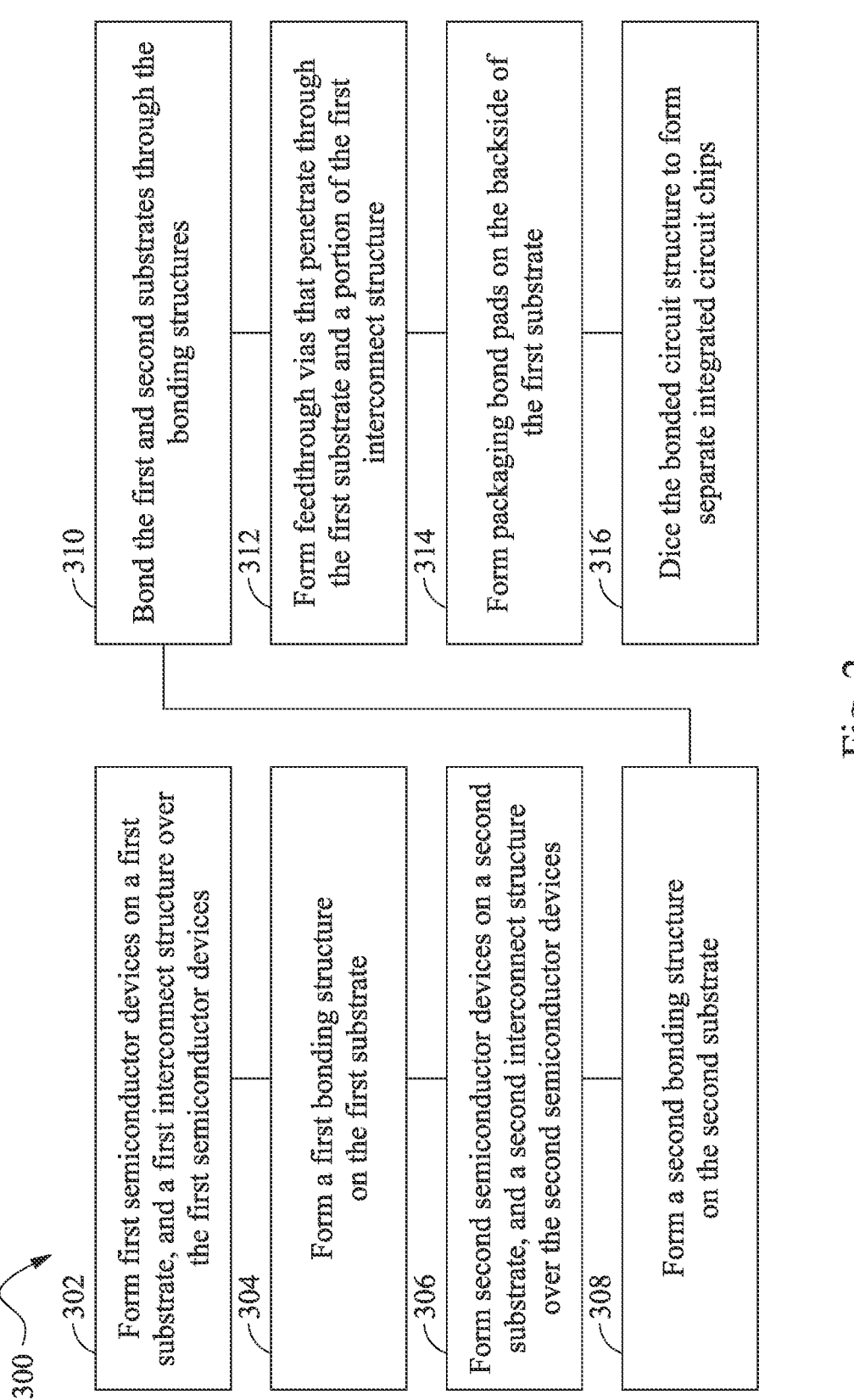
FIG. 2 illustrates a flowchart of a method to form the 3DIC structure of FIG. 1, according to an embodiment of the present disclosure.

FIG. 2 illustrates a flowchart of a method 300 making the 3DIC structure 100, especially the bonding structure 110, constructed according to some embodiments. Other following figures FIGS. 3A-3D and 4A-4P provide sectional views of the bonding structure 110 at various fabrication stages according to some embodiments. The 3DIC structure 100, especially the bonding structure 110 and the method 300 making the same are collectively described below.

Referring to FIG. 2, the method 300 includes an operation 302 to form a first semiconductor devices on a first substrate, and a first interconnect structure over the first semiconductor devices. The method 300 includes an operation 304 to form a first bonding structure on the first interconnect structure. The method 300 includes an operation 306 to form a second semiconductor devices on a second substrate, and a second interconnect structure over the second semiconductor devices. The method 300 includes an operation 308 to form a second bonding structure on the second interconnect structure. The method 300 includes an operation 310 to bond the first and second semiconductor structures through the first and second bonding structures. such that the first and second amorphous surface layers are aligned bonded. The bonding process is implemented at an elevated temperature. Particularly, the bonding process is implemented at a lower temperature due to the disclosed bonding structure. In some embodiment where copper is used for amorphous metal surface layer and bulk crystalline metal layer, the bonding temperature is less than 300° C. In some embodiments, the bonding temperature ranges between 200° C. and 280° C.

The method 300 includes an operation 312 to form various feedthrough vias (FETs) that penetrate through the first semiconductor substrate and a portion of the first interconnect structure. The method 300 includes an operation 314 to form packaging bond pads on the backside of the first semiconductor substrate; and an operation 316 to dice the bonded circuit structure to form separate integrated circuit chips.

Figures 3A, 3B:
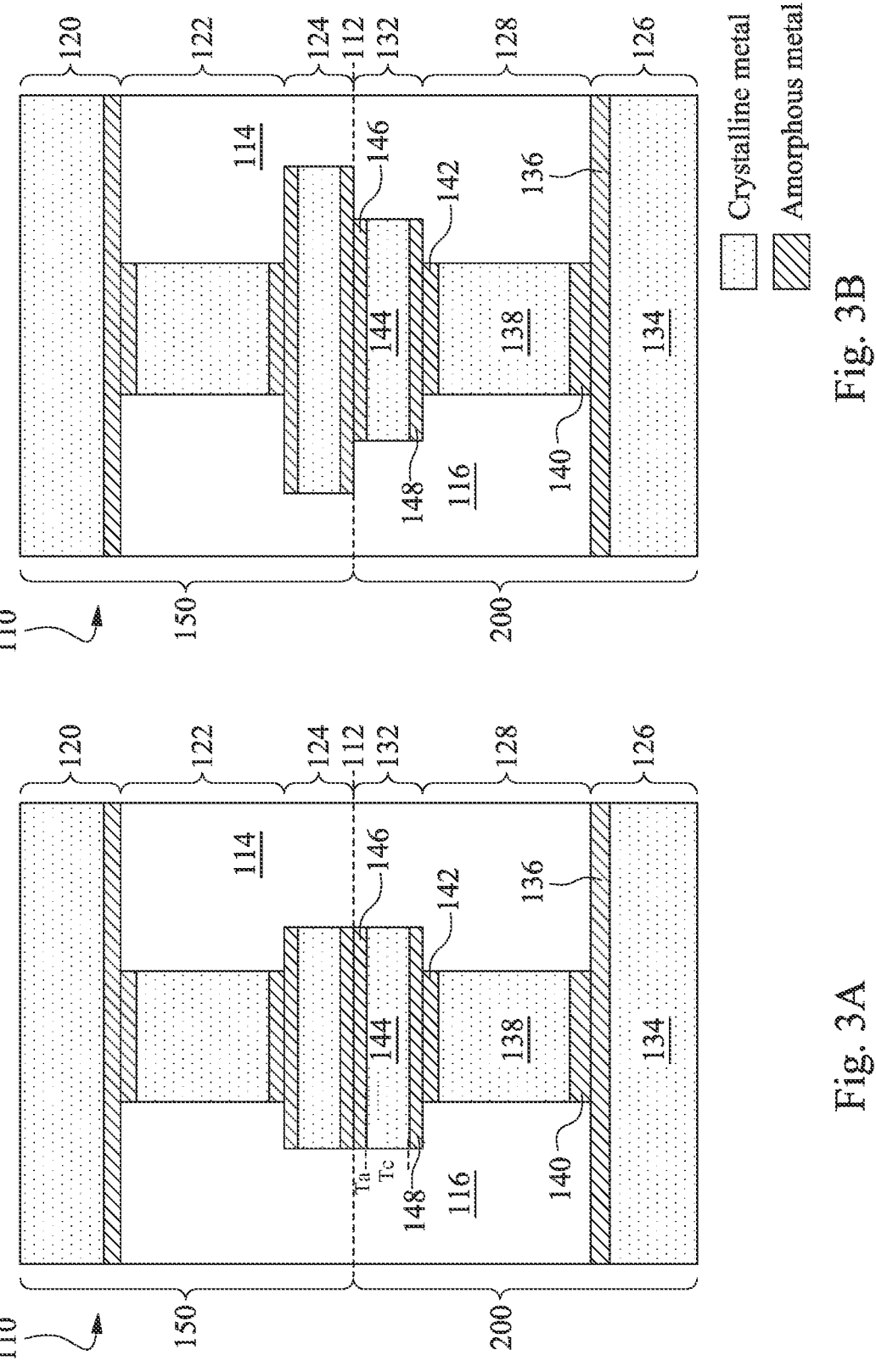
FIGS. 3A, 3B, 3C and 3D illustrate sectional views of a bonding structure of the 3DIC structure of FIG. 1, according to an embodiment of the present disclosure.

The bonding structure 110 in FIG. 1 is further illustrated in FIG. 3A in a sectional view according to some embodiments. The bonding structure is distributed in the first and second semiconductor structures 150 and 200 with a bonding interface 112. The 3DIC structure 100 includes a plurality of the bonding structures 110 configured in the bonding interface 112 to provide mechanical bonding and electrical routing. The bonding structure 110 includes the first bonding structure distributed in the first semiconductor structure 150 and the second bonding structure distributed in the second semiconductor structure 200. The first bonding structure is embedded in one or more dielectric layers 114 of suitable dielectric material, such as silicon oxide, silicon nitride, low-k dielectric material or a combination thereof. Similarly, the second bonding structure is embedded in one or more dielectric layers 116 of suitable dielectric material, such as silicon oxide, silicon nitride, low-k dielectric material or a combination thereof. Accordingly, the bonding interface 112 also includes portions having dielectric-dielectric bonding, such as bonding between the dielectric layers 114 and the dielectric layers 116.

The first semiconductor structure 150 includes a metal line 120 (such as a top metal line or a redistribution line), a bond pad via (BPV) 122 and a bond pad metal (BPM) 124. Similarly, the second semiconductor structure 200 includes a metal line 126 (such as a top metal line or a redistribution line), a bond pad via (BPV) 128 and a bond pad metal (BPM) 132. In the disclosed embodiment, each of these metal features includes a crystalline bulk layer of a metal (such as copper) and an amorphous surface layer of the metal disposed on the crystalline bulk layer, or even two amorphous surface layers of the metal disposed on both surfaces of the crystalline bulk layer. For examples, the metal line 126 includes a crystalline bulk layer 134 of a metal and an amorphous surface layer 136 of the metal; the BPV 128 includes a crystalline bulk layer 138 of the metal and two amorphous surface layers 140 and 142 of the metal; and the BPM 132 includes a crystalline bulk layer 144 of a metal and two amorphous surface layers 146 and 148 of the metal.

The crystalline bulk layer and the corresponding amorphous surface layer disposed on the crystalline bulk layer have a thickness ratio tuned for optimized device characteristics. When bonding temperature is a concern, the thickness Ta of the amorphous surface layer is increased. When the bonding mechanical strength is a concern, the thickness Tc of the crystalline bulk layer is increased. In some embodiments, the ratio of Ta/Tc ranges between 10% and 30%.

Figures 3C, 3D:
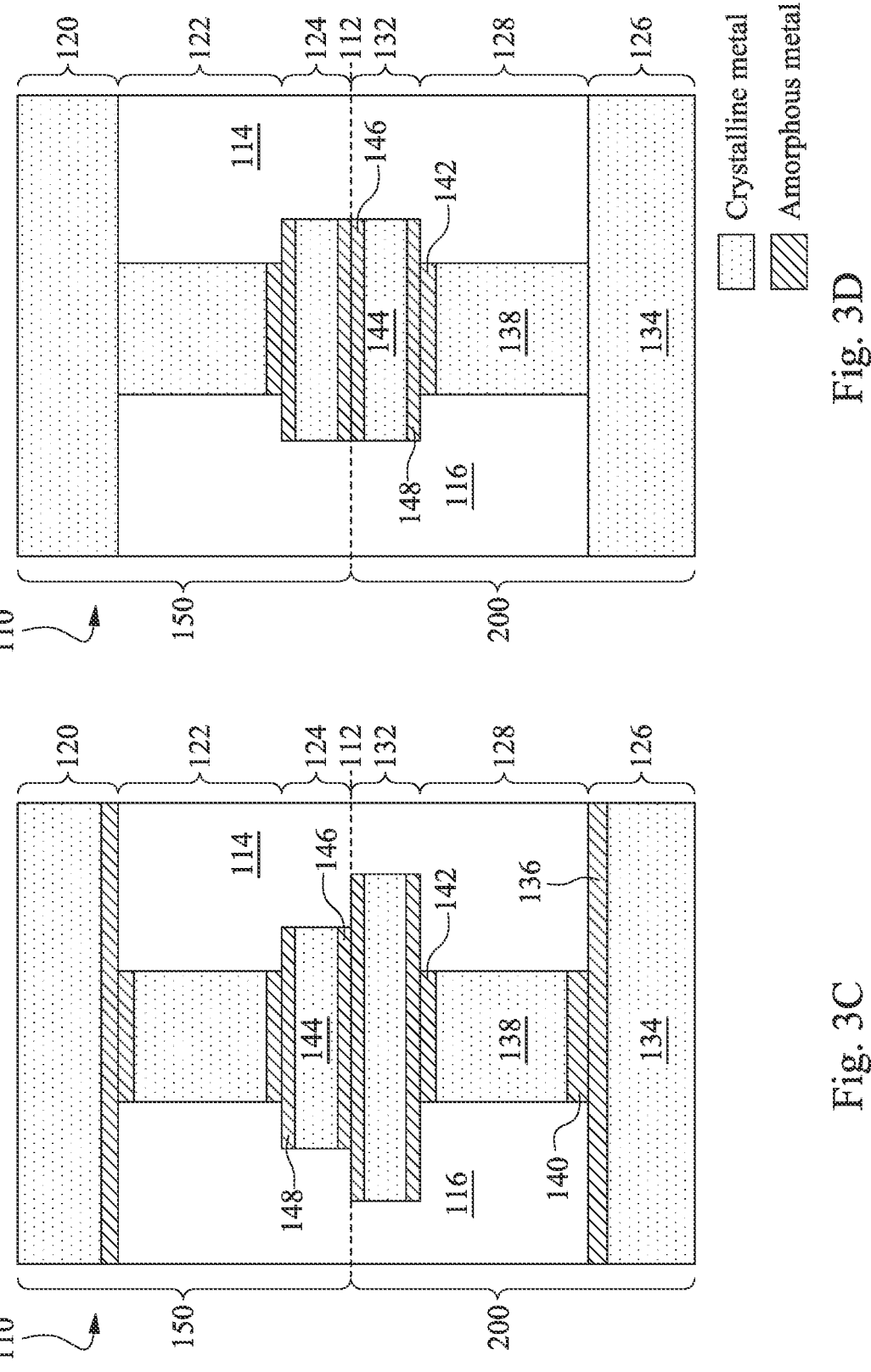

The bonding structure 110 may be designed differently, such as those illustrated in FIGS. 3C-3D in sectional views, according to various embodiments. For example, the BPM in the top semiconductor structure and the BPM in the bottom semiconductor structure may have different widths, as illustrated in FIGS. 3B and 3C. In other examples, the amorphous surface layer may be eliminated from the metal lines and one surface of the BPV, as illustrated in FIG. 3D.

The method to form the bonding structure 110, such as a portion of the bonding structure 110 in the bottom semiconductor structure 200, is further described with reference to FIGS. 4A-4P in sectional views and at various fabrication stages.

Figures 4A, 4B, 4C, 4D, 4E, 4F:
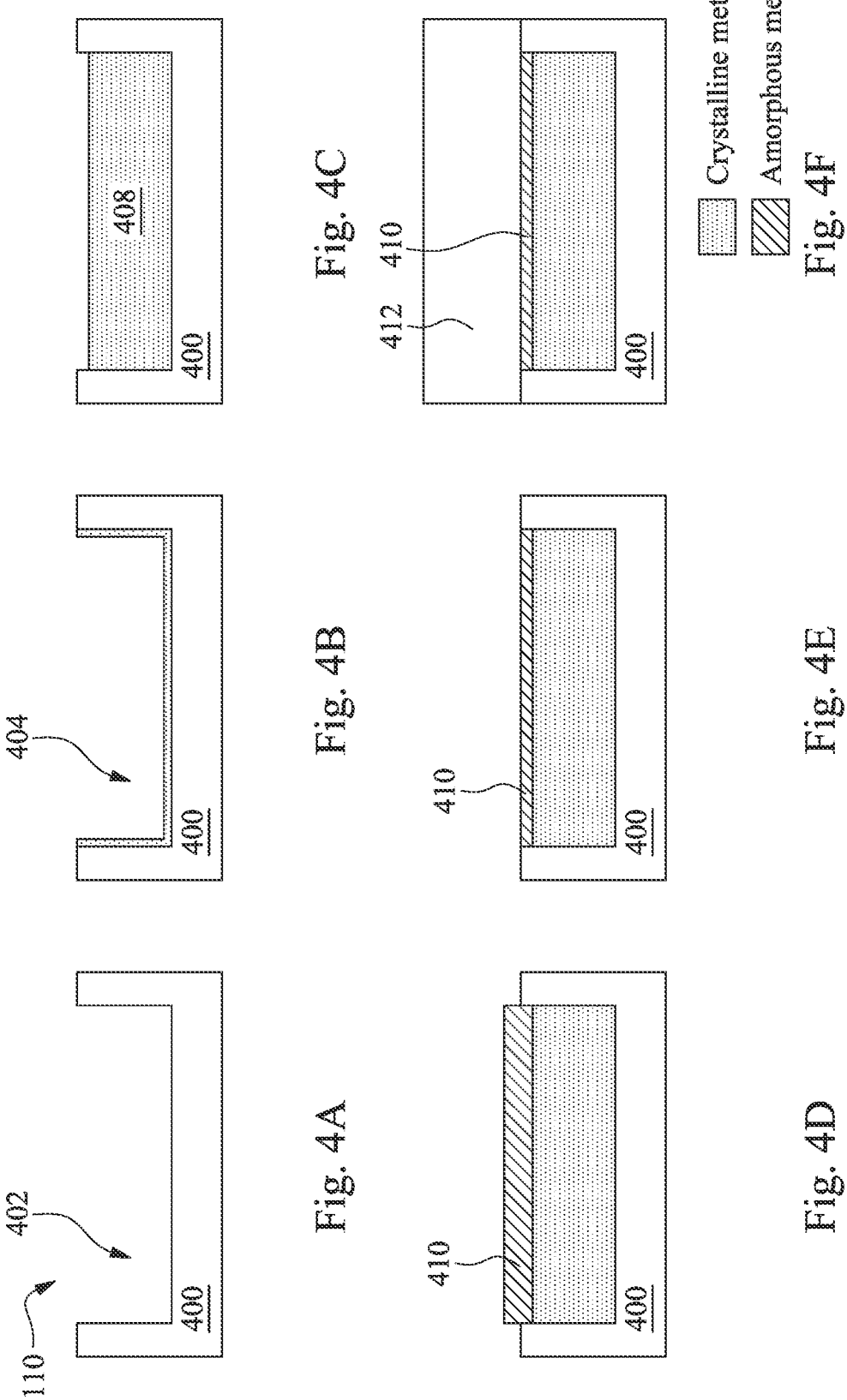
FIGS. 4A-4P illustrate sectional views of a bonding structure of the 3DIC structure of FIG. 1 at various fabrication stages, according to an embodiment of the present disclosure.

Referring to FIG. 4A, a dielectric layer 400, such as silicon oxide, low-k dielectric layer or other suitable dielectric material, is patterned to form a trench 402 using a patterning method including lithography process and etch.

Referring to FIG. 4B, a seed layer 404 of a metal (such as copper) is conformed deposited in the trench 402 using a suitable method, such as physical vapor deposition (PVD), ALD, or other suitable method. The seed layer 404 provides a surface for the following bulk deposition. In some embodiments, the thickness of the seed layer 404 ranges between 10Angstrom and 100 Angstrom.

Referring to FIG. 4C, a bulk metal (such as copper) layer 408 is deposited on the seed layer by plating such as ECP. The bulk metal is deposited with a crystalline structure such with (111) plane orientation in parallel with the bonding interface, or trench bottom surface in FIG. 4C. In some embodiments, the crystalline structure with (111) plane orientation of the bulk metal layer 408 may include minor portion (less than 3% in volume) of the metal in some other structure, such as crystalline structure in other orientation or amorphous structure. The top surface is recessed from the top surface of the dielectric layer 400, which is achieved either by controlling the plating time or a procedure that includes plating, chemical mechanical polishing (CMP) and etching to recess. The seed layer 404 is thin and is not illustrated in the following figures.

Referring to FIG. 4D, an amorphous surface layer 410 of the metal is deposited in the trench 402 using a plating, such as ECP to fill in the trench. The plating method is similar to the plating method to form the bulk metal layer 408 but the plating conditions and plating parameters are tuned differently to achieve the desired amorphous structure, such as described previously.

In some embodiments for both ECP processes, the plating solution includes Copper sulfate ($CuSO_4$), hydrochloric acid, sulfuric acid, or a combination thereof. The plating solution may further include other additives to tune and optimize plating solution, such as its plating rate, plating selectivity, plating solution stability and other effects. In some embodiments, the additive used in the plating solution may include bis(3-sulfopropyl) disulfide (SPS), polyethylene glycol (PEG), gelatin, Janus Green B (JGB), mercaptopropylsulfonic acid (MPS), sodium dodecyl sulfate (SDS), or a combination thereof.

However, the two ECP processes to form crystalline metal layer and amorphous metal layer are designed differently to achieve the respective structures, such as amorphous Cu layer and a crystalline Cu layer (or particularly, a crystalline Cu layer with a (111) plane in parallel to the bonding interface). This includes, but not limited to, different additives in plating solution; different pH values of the plating solution; different electroplating modes (such as direct current (DC) mode or pulse mode); plating solution temperature; frequency of the pulse mode; duty cycle (ratio of the power duration in one cycle); or a combination thereof. The two ECP processes are further described below according to various embodiments. In some embodiments, forming the crystalline Cu layer (particularly, a crystalline Cu layer with a (111) plane in parallel to the bonding interface) includes a relatively a first amount of additives and forming the amorphous Cu layer includes a second amount of additives greater than the first amount of additives. In some embodiments, forming the crystalline Cu layer (particularly, a crystalline Cu layer with a (111) plane in parallel to the bonding interface) includes applying both pulse power and DC power and forming the amorphous Cu layer includes applying only DC power. In some embodiments, forming the crystalline Cu layer (particularly, a crystalline Cu layer with a (111) plane in parallel to the bonding interface) includes a first temperature of the plating solution and forming the amorphous Cu layer includes a second temperature of the plating solution less than the first temperature.

Referring to FIG. 4E, an amorphous surface layer 410 is recessed so that the top surfaces of the dielectric layer 400 and the amorphous surface layer 410 are coplanar by a suitable method such as CMP.

Referring to FIG. 4F, another dielectric layer 412 is deposited using a proper method such as chemical vapor deposition (CVD), flowable CVD, other suitable method or a combination thereof. The dielectric layer 412 includes one or more dielectric material, such as silicon oxide, silicon nitride, other suitable dielectric material or a combination thereof.

Figures 4G, 4H, 4I, 4J, 4K, 4L:
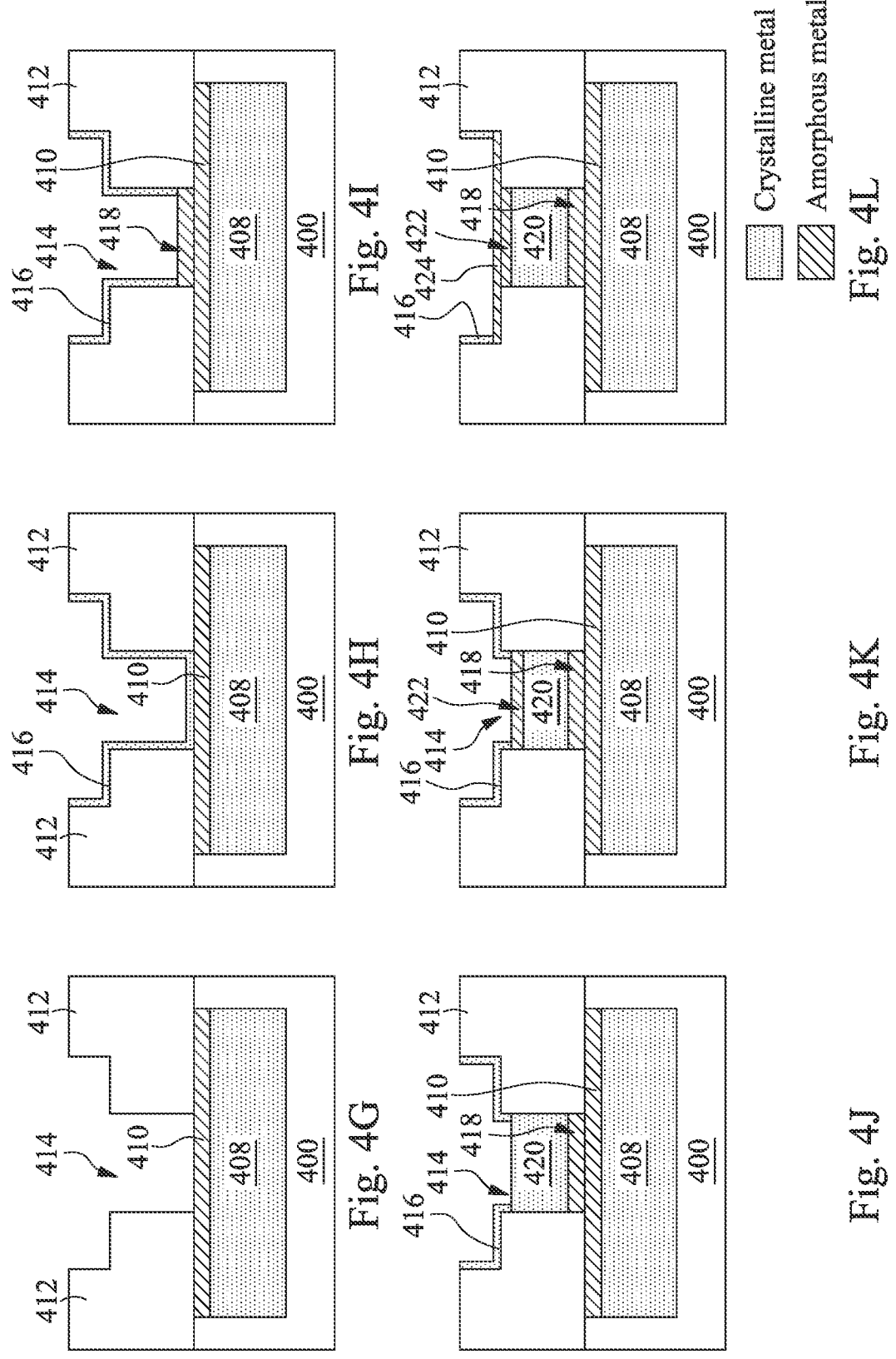

Referring to FIG. 4G, the dielectric layer 412 is patterned to form a trench 414 using a patterning method including lithography process and etch. In the present embodiment, the trench 414 includes a bottom portion and a top portion with different dimensions and is formed using multiple patterning, such as a method similar to dual damascene process.

Referring to FIG. 4H, a seed layer 416 of a metal (such as copper) is conformed deposited in the trench 414 using a suitable method, such as PVD or other suitable method. The seed layer is thin and provides a surface for the following bulk deposition.

Referring to FIG. 4I, an amorphous surface layer 418 of the metal (such as copper) is deposited by plating such as ECP. The amorphous surface layer 418 only formed in the bottom portion of the trench 414 and is recessed from the bottom portion of the trench 414, which is achieved by controlling the plating time or other suitable method.

Referring to FIG. 4J, a bulk metal layer 420 of the metal (such as copper) is deposited on the amorphous surface layer 418 by plating such as ECP. The bulk metal layer 420 only formed in the bottom portion of the trench 414 and is recessed from the bottom portion of the trench 414, which is achieved by controlling the plating time or other suitable method.

Referring to FIG. 4K, another amorphous surface layer 422 of the metal (such as copper) is deposited by plating such as ECP. The amorphous surface layer 422 is only formed in and fills the bottom portion of the trench 414, which is achieved by controlling the plating time or other suitable method.

Referring to FIG. 4L, another amorphous surface layer 424 of the metal (such as copper) is deposited by plating such as ECP. The amorphous surface layer 424 is formed in the top portion of the trench 414, which is achieved by controlling the plating time or other suitable method.

Figures 4M, 4N, 4O:
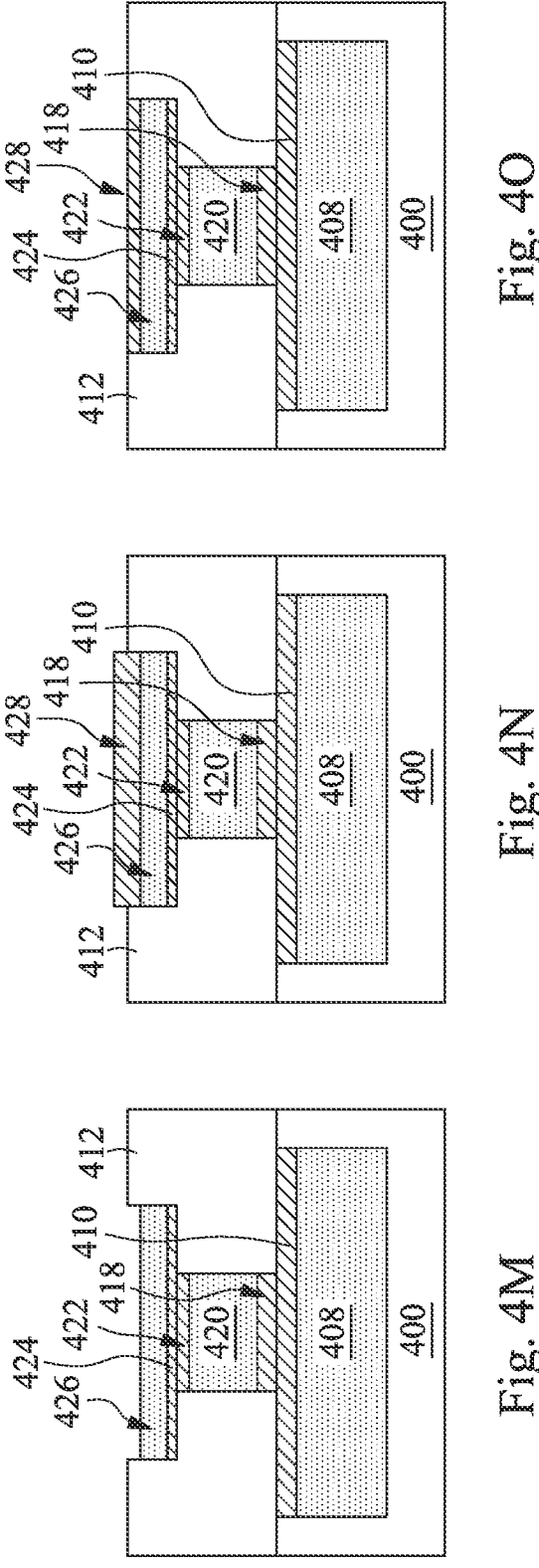

Referring to FIG. 4M, a bulk metal layer 426 of the metal (such as copper) is deposited on the amorphous surface layer 424 by plating such as ECP. The bulk metal layer 426 only formed in the top portion of the trench 414 and is recessed from the top portion of the trench 414, which is achieved by controlling the plating time or other suitable method.

Referring to FIG. 4N, an amorphous surface layer 428 of the metal is deposited in the trench 414 using a plating, such as ECP to fill in the trench 414.

Referring to FIG. 4O, an amorphous surface layer 428 is recessed so that the top surfaces of the dielectric layer 412 and the amorphous surface layer 428 are coplanar by a suitable method such as CMP.

Figure 4P:
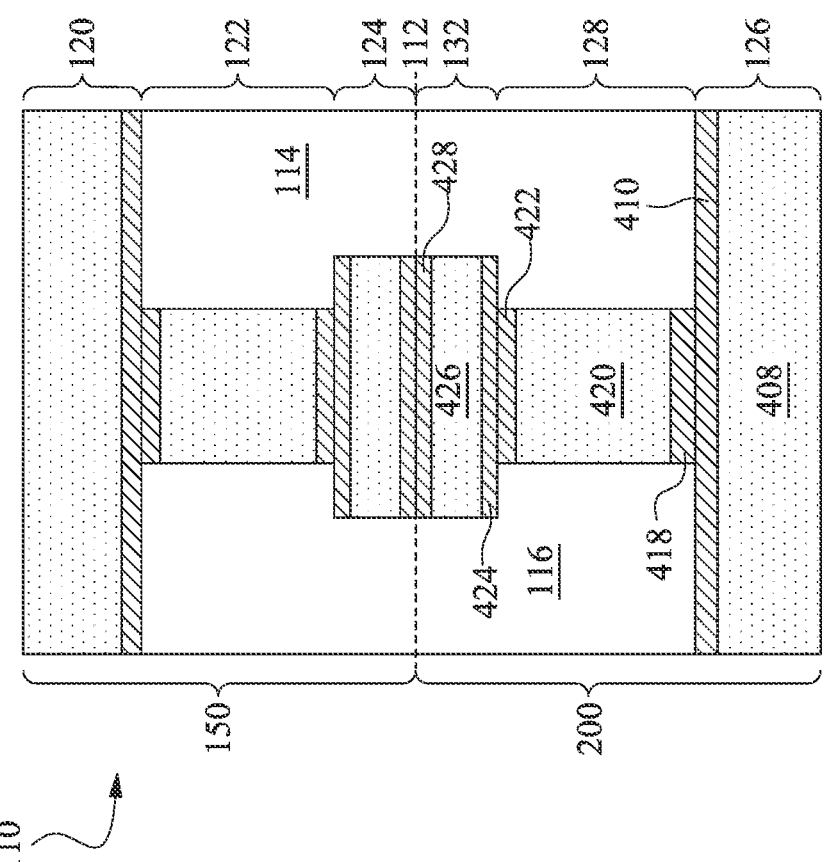

Referring to FIG. 4P, the formation of the bottom bonding structure is described as above. The bottom bonding structure is formed in the bottom semiconductor structure. The top bonding structure is similarly formed in the top semiconductor structure and is boned to the bottom semiconductor structure such that the bonding structure provides bonding and electrical routing of the two semiconductor structures.

Although not limiting, the present disclosure offers advantages for stacked 3DIC semiconductor structures by incorporating disclosed bonding structure. The metal bonding structure includes various bonding features. The bonding feature includes a crystalline metal layer and an amorphous metal surface layer disposed on the crystalline metal layer. The bonding feature is formed by a plating process, such as Electro-Chemical Plating Deposition (ECP). More specifically, the metal bonding feature is formed by a procedure that includes forming a seed metal layer using physical vapor deposition (PVD), atomic layer deposition (ALD), other suitable method or a combination thereof. The procedure further includes a first ECP process to form amorphous surface layer and a second ECP process to form crystalline bulky layer. The two ECP processes are designed differently to achieve the respective structures, such as amorphous Cu layer and a crystalline Cu layer (or particularly, a crystalline Cu layer with a (111) plane in parallel to the bonding interface). This includes, but not limited to, different additives in plating solution; different pH values of the plating solution; different electroplating modes (such as direct current (DC) mode or pulse mode); or a combination thereof.

The corresponding interface between the metal bonding feature and the metal via is also enhanced by the amorphous surface layer since similar stress of the interface. In some embodiments, the metal via has a structure similar to that of the metal bonding feature for the similar reasons including enhanced mechanical strength.

Such metal heterogenous bonding structure can benefit both the bonding strength and reduce the bonding temperature. Our experiments and theoretical analysis indicate that the bonding thermal process (such as annealing under pressure) to the amorphous surface layers can be achieved with a reduced bonding temperature and the crystalline bulk layer, especially with a (111) plane oriented in parallel with the bonding interface, can achieve higher mechanical bonding strength, thus improving bonding strength and reducing the temperature of the bonding process overall.

One aspect of the present disclosure pertains to an integrated circuit (IC) packaging structure that includes a bottom circuit structure having first semiconductor devices on a first substrate, a first interconnect structure over the first semiconductor devices, and a first bonding structure over the first interconnect structure; and a top circuit structure having second semiconductor devices on a second substrate, a second interconnect structure underlying the second semiconductor devices, and a second bonding structure underlying the second interconnect structure. The first bonding structure includes a first metal feature having a first crystalline bulk layer of a metal and a first amorphous surface layer of the metal. The second bonding structure includes a second metal feature having a second crystalline bulk layer of the metal and a second amorphous surface layer of the metal. The top circuit structure is bonded to the bottom circuit structure through the first and second amorphous surface layers.

Another aspect of the present disclosure pertains to an integrated circuit (IC) packaging structure that includes a bottom circuit structure having first semiconductor devices on a first substrate, a first interconnect structure over the first semiconductor devices, and a first bonding structure over the first interconnect structure; and a top circuit structure having second semiconductor devices on a second substrate, a second interconnect structure underlying the second semiconductor devices, and a second bonding structure underlying the second interconnect structure. The first bonding structure includes a first metal feature having a first crystalline bulk layer of a metal. The second bonding structure includes a second metal feature having a second crystalline bulk layer of the metal. The top circuit structure is bonded to the bottom circuit structure through a first amorphous surface layer of the metal sandwiched between the first and second crystalline bulk layers, and a dielectric-dielectric bonding structure.

Another aspect of the present disclosure pertains to a method of forming an integrated circuit (IC) packaging structure. The method includes forming a bottom circuit structure having first semiconductor devices on a first substrate, and a first interconnect structure over the first semiconductor devices; forming a first bonding structure over the first interconnect structure, wherein the first bonding structure includes a first metal feature having a first crystalline bulk layer of a metal and a first amorphous surface layer of the metal; forming a top circuit structure having second semiconductor devices on a second substrate, and a second interconnect structure underlying the second semiconductor devices; forming a second bonding structure underlying the second interconnect structure, wherein the second bonding structure includes a second metal feature having a second crystalline bulk layer of the metal and a second amorphous surface layer of the metal; and bonding the top circuit structure and the bottom circuit structure together such that the first and second amorphous surface layers are aligned bonded.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) packaging structure, comprising:
   a bottom circuit structure having first semiconductor devices on a first substrate, a first interconnect structure over the first semiconductor devices, and a first bonding structure over the first interconnect structure; and
   a top circuit structure having second semiconductor devices on a second substrate, a second interconnect structure underlying the second semiconductor devices, and a second bonding structure underlying the second interconnect structure, wherein
   the first bonding structure includes a first metal feature having a first crystalline bulk layer of a metal and a first amorphous surface layer of the metal,
   the second bonding structure includes a second metal feature having a second crystalline bulk layer of the metal and a second amorphous surface layer of the metal, and
   the top circuit structure is bonded to the bottom circuit structure through the first and second amorphous surface layers.

2. The IC packaging structure of claim 1, wherein each of the first and second crystalline bulk layers includes a (111) plane in parallel with a bonding interface between the first and second amorphous surface layers.

3. The IC packaging structure of claim 2, wherein the metal is copper.

4. The IC packaging structure of claim 1, wherein the first metal feature of the first bonding structure further includes a third amorphous surface layer of the metal configured such that the first crystalline bulk layer is sandwiched between the first and third amorphous surface layers.

5. The IC packaging structure of claim 4, wherein the second metal feature of the second bonding structure further includes a fourth amorphous surface layer of the metal configured such that the second crystalline bulk layer is sandwiched between the second and fourth amorphous surface layers.

6. The IC packaging structure of claim 5, wherein
   the first bonding structure further includes a first metal via of the metal contacting the first metal feature;
   the first metal via includes a third crystalline bulk layer of the metal and a fifth amorphous surface layer of the metal disposed on the third crystalline bulk layer; and
   the fifth amorphous surface layer directly contacts the third amorphous surface layer.

7. The IC packaging structure of claim 6, wherein the first metal via further includes a sixth amorphous surface layer of the metal configured such that the third crystalline bulk layer is sandwiched between the fifth and sixth amorphous surface layers.

8. The IC packaging structure of claim 7, wherein
   the second bonding structure further includes a second metal via of the metal contacting the second metal feature;
   the second metal via includes a fourth crystalline bulk layer of the metal and a seventh amorphous surface layer of the metal disposed on the fourth crystalline bulk layer; and
   the seventh amorphous surface layer directly contacts the fourth amorphous surface layer.

9. The IC packaging structure of claim 8, wherein the second metal via further includes an eighth amorphous surface layer of the metal configured such that the fourth crystalline bulk layer is sandwiched between the seventh and eighth amorphous surface layers.

10. The IC packaging structure of claim 1, wherein the metal includes Au, Ag, Pd, or a combination thereof.

11. The IC packaging structure of claim 1, wherein the metal includes Ni, Co, or other suitable metal, or a combination thereof.

12. An integrated circuit (IC) packaging structure, comprising:
   a bottom circuit structure having first semiconductor devices on a first substrate, a first interconnect structure over the first semiconductor devices, and a first bonding structure over the first interconnect structure; and
   a top circuit structure having second semiconductor devices on a second substrate, a second interconnect structure underlying the second semiconductor devices, and a second bonding structure underlying the second interconnect structure, wherein
   the first bonding structure includes a first metal feature having a first crystalline bulk layer of a metal,
   the second bonding structure includes a second metal feature having a second crystalline bulk layer of the metal, and
   the top circuit structure is bonded to the bottom circuit structure through a first amorphous surface layer of the metal sandwiched between the first and second crystalline bulk layers, and a dielectric-dielectric bonding structure.

13. The IC packaging structure of claim 12, wherein the first metal feature of the first bonding structure further includes a second amorphous surface layer of the metal configured such that the first crystalline bulk layer is sandwiched between the first and second amorphous surface layers, and wherein the metal is copper.

14. The IC packaging structure of claim 13, wherein the second metal feature of the second bonding structure further includes a third amorphous surface layer of the metal configured such that the second crystalline bulk layer is sandwiched between the first and third amorphous surface layers.

15. The IC packaging structure of claim 14, wherein
   the first bonding structure further includes a first metal via of the metal contacting the first metal feature;
   the first metal via includes a third crystalline bulk layer of the metal and a fourth amorphous surface layer of the metal disposed on the third crystalline bulk layer; and
   the fourth amorphous surface layer directly contacts the second amorphous surface layer.

16. The IC packaging structure of claim 15, wherein the first metal via further includes a fifth amorphous surface layer of the metal configured such that the third crystalline bulk layer is sandwiched between the fourth and fifth amorphous surface layers.

17. The IC packaging structure of claim 16, wherein the second bonding structure further includes a second metal via of the metal contacting the second metal feature;

the second metal via includes a fourth crystalline bulk layer of the metal and a sixth amorphous surface layer of the metal disposed on the fourth crystalline bulk layer; and the sixth amorphous surface layer directly contacts the third amorphous surface layer.

18. The IC packaging structure of claim 12, wherein each of the first and second crystalline bulk layers includes a (111) plane in parallel with the first amorphous surface layer.

19. A method of forming an integrated circuit (IC) packaging structure, comprising:

forming a bottom circuit structure having first semiconductor devices on a first substrate, and a first interconnect structure over the first semiconductor devices;

forming a first bonding structure over the first interconnect structure, wherein the first bonding structure includes a first metal feature having a first crystalline bulk layer of a metal and a first amorphous surface layer of the metal;

forming a top circuit structure having second semiconductor devices on a second substrate, and a second interconnect structure underlying the second semiconductor devices;

forming a second bonding structure underlying the second interconnect structure, wherein the second bonding structure includes a second metal feature having a second crystalline bulk layer of the metal and a second amorphous surface layer of the metal; and bonding the top circuit structure and the bottom circuit structure together such that the first and second amorphous surface layers are aligned and bonded.

20. The method of claim 19, wherein the metal is copper; and the bonding the top circuit structure and the bottom circuit structure together is implemented at a bonding temperature ranging between 200° C. and 280° C.

* * * * *